United States Patent [19]
Braden

[11] Patent Number: 5,944,897
[45] Date of Patent: Aug. 31, 1999

[54] PASTE APPLICATION AND RECOVERY SYSTEM FOR IPC TERMINATION UNIT

[75] Inventor: Denver Braden, San Marcos, Calif.

[73] Assignee: Chip Star, Inc., San Marcos, Calif.

[21] Appl. No.: 08/944,329

[22] Filed: Oct. 6, 1997

[51] Int. Cl.⁶ .................................................. B05C 21/00
[52] U.S. Cl. .................... 118/600; 118/603; 118/610; 118/211; 118/212; 118/239; 118/244; 118/261
[58] Field of Search ..................... 118/600, 603, 118/610, 211, 212, 239, 244, 261, 422, 429; 427/58, 123, 126.1, 345, 428, 405, 434.5

[56] References Cited

U.S. PATENT DOCUMENTS

| | | | |
|---|---|---|---|
| 4,004,045 | 1/1977 | Stelter | 427/345 |
| 4,594,962 | 6/1986 | Focke | 118/212 |
| 4,900,586 | 2/1990 | Kanamori et al. | 118/503 |
| 5,226,382 | 7/1993 | Braden | 118/213 |

FOREIGN PATENT DOCUMENTS 3-288570  12/1991  Japan ..................................... 118/600

OTHER PUBLICATIONS

George L. Booth, *Coating Equipment and Processes*, "Gravure Coaters", pp. 149–151, 1970.

*Primary Examiner*—Laura Edwards
*Attorney, Agent, or Firm*—John J. Murphey

[57] ABSTRACT

An improved chip termination or application wheel for applying a layer of silver paste to the edge or end of a chip including a wheel that is defined by a broad circumferential surface, for contact with the chip, the surface containing an increased surface area for accepting a larger amount of termination paste for transfer to the edge of a chip.

11 Claims, 4 Drawing Sheets

PASTE APPLICATION AND RECOVERY SYSTEM FOR IPC TERMINATION UNIT

BACKGROUND OF THE INVENTION

1. Field of the Invention

This invention pertains to the field of passive component chip termination machines. More particularly, it pertains to a paste recovery system for cleaning the paste recovered from the paste application wheel following the application of paste to the chip.

2. Description of the Prior Art

Passive component chips, such as capacitor chips, or just "chips" are used throughout the computer industry. If they are capacitors, they are small devices made of minute layers of electrically-conductive material separated by like minute layers of dielectric ceramic material where the total size of the chip is smaller than a grain of rice. The conductive layers are electrically joined together by having a silver-based paste applied along opposed edges. The paste, called "termination" is dried and later fired. The chip is soldered directly to the copper traces of a computer mother board to complete the desired circuit therein.

Chips are being improved virtually daily. There is also constant pressure to reduce their overall size. A secondary process overlays the silver termination with a layer of nickel that acts as a barrier to prevent migration of silver ions from the chip to the copper on the circuit board. The nickel layer is then overlayed with a second solder layer for direct soldering to the circuit board. More and different treatments are designed for the chip to make it more efficient, easier to apply to the circuit board, and to make it last longer in the circuit.

One of the latest treatments for chips is to increase the size of the paste blob that is applied to the ends or edges of the chips. This is done for reasons that include a greater reservoir of silver ions to withstand the later nickel and secondary solder treatments. Previously, the aim in chip termination was to place the minimum amount of paste along the end or edge of the chip; now, in certain cases, the opposite is true and more paste is required.

The chip termination machines of the prior art carry the chips in slots and masks formed in a continuous metal belt or carrier. The chip is loaded in the belt at a location remote from the paste application unit and then conveyed thereto in the belt. After application of paste to one end or edge of the chip, the chip is passed through a paste drying oven and then reversed in its position in the slot and mask and conveyed to a second paste application unit where paste is applied to the opposite end or edge and then the chip is again passed through the oven to dry the paste.

In all this handling the chip is liable to move in the mask and not be totally aligned when it is presented to the paste application unit. It is vitally important to have the chip properly aligned in the mask so that the paste covers only a specific portion of the chip. Should the paste be applied in a manner that is not perfectly parallel to the end or edge of the chip, the electrical properties of the chip may be grossly distorted.

It has been the past practice to contact the appropriate end or edge of the chip with a paste termination or application wheel having a paste application circumferential surface that is wider than the end or edge to be terminated. This surface is arranged parallel to the proper orientation of the chip in the carrier belt so that the two come into contact and the chip is aligned or moved into alignment in the mask so that the paste is applied in a parallel band.

With this new requirement for a larger amount of paste to be applied to the chip, the contact between the chip and the circumferential surface on the paste application wheel actually works to the disadvantage because the contact tends to provide sufficient surface tension to the liquid paste to pull off any excess from the chip. Accordingly, there is needed a new design of paste application wheel that will apply a larger glob of paste on the chip while at the same time contacting the chip to align it properly in the mask.

In addition, there is an ongoing problem of some of the chips being pulled out of the masks during contact with the termination or application wheel. This is thought to be the result of the mask losing its gripping power, a thinner than usual chip, or a combination of the two reasons. In any event, the chip finds its way into the paste that is normally scraped off of the wheel and also finds itself becoming mixed with the paste that remains in the reservoir under the application wheel. When these chips become involved with the paste they often become lodged between the wheel and the doctor blade causing lines in the paste pattern on the termination wheel. Accordingly, there remains a problem of removing the chips captured this way from the inventory of paste remaining in the paste application unit to ensure continuous processing of the chips.

SUMMARY OF THE INVENTION

This invention provides the solution to both problems. The first part of the invention is an improved chip application wheel for applying a layer of silver paste to the end or edge of a capacitor-type chip comprising a wheel that is defined by a broad circumferential surface, for contact with the chip, that contains an increased surface area for accepting a larger amount of termination paste for transfer to the end or edge of a computer chip.

The second part of the invention is an improved paste recovery unit that removes solid pieces of paste and chips dragged out of the carrying tape. It comprises a paste application wheel that is defined by a broad circumferential surface, for contact with the chip, that contains an increased surface area for accepting a larger amount of termination paste for transfer to the end or edge of a chip; a liquid paste reservoir for holding an inventory of liquid paste therein into which said circumferential surface of said paste application wheel is arranged to dip to receive a new load of paste; a knife arranged to contact said paste application wheel circumferential surface following its contact with the chip and prior to its later contact with the paste in said reservoir to drop the unused paste and chips removed from said belt into a by-pass loop; a closed by-pass loop flow path out from said reservoir that loops back into another portion of said reservoir for flow of liquid paste there-through; a pump arranged in said by-pass loop for moving said paste captured from said knife and said chips recovered therewith from said paste; and, a filter in said by-pass loop for straining out hard pieces of paste and chips from said paste to free the paste for further use. In one embodiment of the invention there is provided a replaceable element provided for insertion in the paste recovery system that removes the solids and trapped chips in one easy motion.

Accordingly, the main object of this invention is an improved wheel for applying a large amount of paste to the end or edge of a chip. Other objects include a device for providing an increased amount of paste to the end or edge of a chip while aligning the chip in the carrier belt; a paste recovery system for separating out the solid paste particles and chips that are dragged out of the masks during the termination process; a replaceable device for use in cleaning out the solid paste particles and chips from the paste reservoir; and a means of processing the chips with these improved devices so that they can be produced in greater quantity and at higher speeds than presently available.

These and other objects of the invention may be determined by reading the description of the preferred embodiments along with the drawings attached hereto. The scope of protection sought by the inventor may be gleaned from a fair reading of the claims that conclude this specification.

DESCRIPTION OF THE PREFERRED EMBODIMENTS

Figure 1:
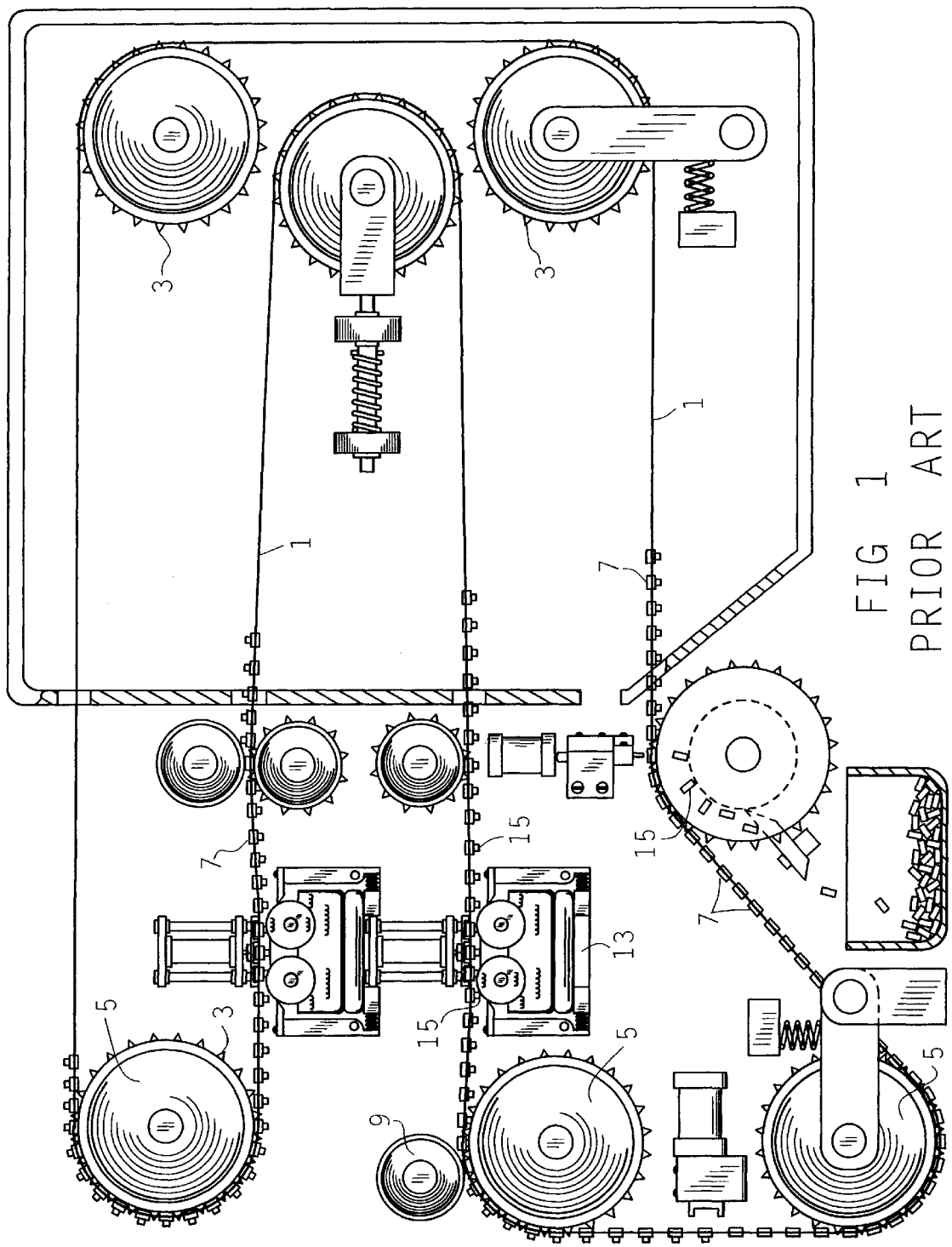
FIG. 1 is a side view of a typical chip termination machine.

Turning now to the drawings where elements are identified by numbers and like elements are identified by like numbers throughout the nine figures, FIG. 1 shows the general machine that introduced chip termination via carrier belt to the industry. It generally comprises an endless metal carrier belt 1 having a plurality of holes formed along one or both edges (not shown) for receipt of the cogs 3 of drive wheels 5 that propel belt 1 along its journey through various process stations. A plurality of slots (not shown) are formed in belt 1 and are surrounded by elastomeric material termed "masks" 7.

Figure 2:
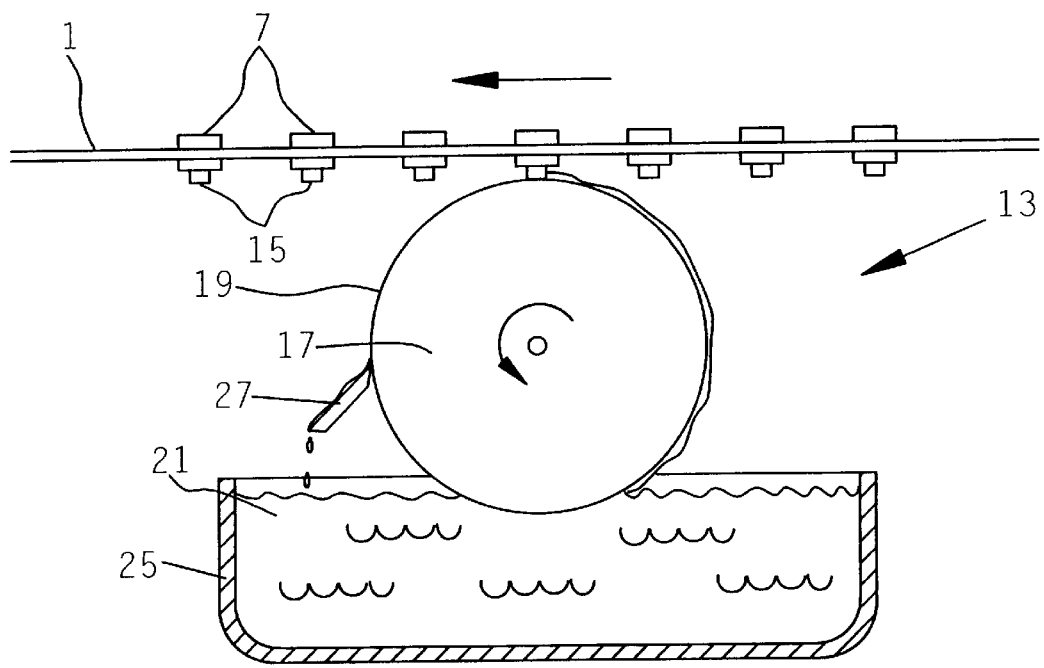
FIG. 2 is a side view of the typical paste application wheel found in machines of the type depicted in FIG. 1.

An inventory of chips (not shown) are loaded into masks 7 and conveyed to a positioner device 9 and then onto a termination unit 13 where a small, controlled amount of the silver paste is applied to one edge of the chip 15. As shown in FIG. 2, the paste application unit 13 generally comprises a wheel 17, having a flat circumferential surface 19 that dips into an inventory 21 of liquid silver paste held in a reservoir 25. Wheel surface 19 is later scraped of the residual paste by a doctor blade 27 set above reservoir 25.

As previously described, two areas of this process require further development. The first is to somehow place a larger quantity of silver paste on the edge of the chip and the second is to remove the chips from the silver paste that are unintentionally dragged out of the masks during the paste application operation. In addition, the circumferential edge of the wheel must physically contact the edge of the chip to insure that the paste is placed therein in a manner that is parallel to the edge of the chip.

Figures 3, 4, 5:
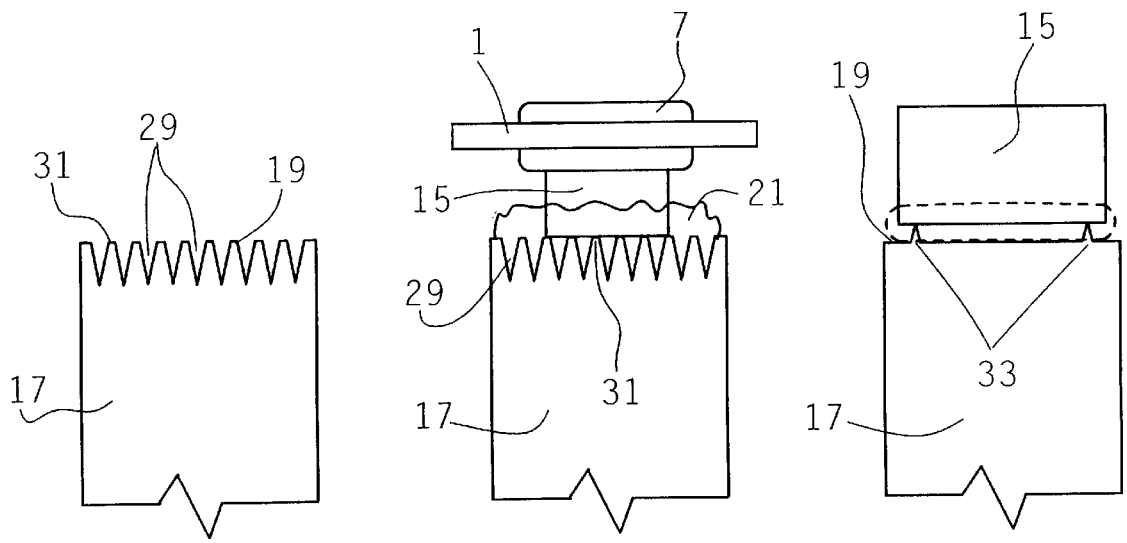
FIG. 3 is a close-up end view of the contour of the circumferential surface of this portion of the invention.
FIG. 4 is a similar view as in FIG. 3 showing how the wheel contacts the chip and applies paste along one edge thereof.
FIG. 5 is a similar view as in FIGS. 3 and 4 showing how another embodiment of the increased surface area of the application wheel accepts a larger amount of paste for transferring to the chip.

As shown in FIG. 3, the circumferential surface 19 of wheel 17 is increased in area by cutting a series of V-shaped slots 29. Preferably, such slots are angled at 60° from the horizontal and the top lands 31 are set at 0.002 to 0.005 inches wide and aligned to form a flat surface thereacross. Lands 31 can be set at lesser and wider dimensions and slots 29 can be set at different angles and such are fully contemplated in this invention. One of the benefits of this form of increasing the area on the top of wheel 17 is that contact between surface 19 and chip 15 will set the chip straight and doctor blade 27 will scrape off all the residual or untransferred paste along with all its solid particles, dust and chips. As shown in FIG. 4, the increased surface area on slots 29 and lands 31 allow a greater pickup of paste 21 from the application or termination wheel for placement on the lower edge of chip 15. Simultaneously therewith, top lands 31 contact the lower edge of chip 15 to insure the paste is applied in a band that is parallel to the edge of the chip.

FIG. 5 shows another embodiment of the invention where the surface 19 of wheel 17 is provided with two prongs 33 in place of top lands 31. Prongs 33 are pointed and contact chip 17 at two locations that are widely spaced-apart so that chip 17 is also straightened in the mask (not shown for clarity). By using two prongs to hold chip 17 spaced apart from wheel surface 19, more paste (shown in dotted lines) is allowed to be carried on wheel 17 for transfer to the edge of chip 17.

Figure 6:
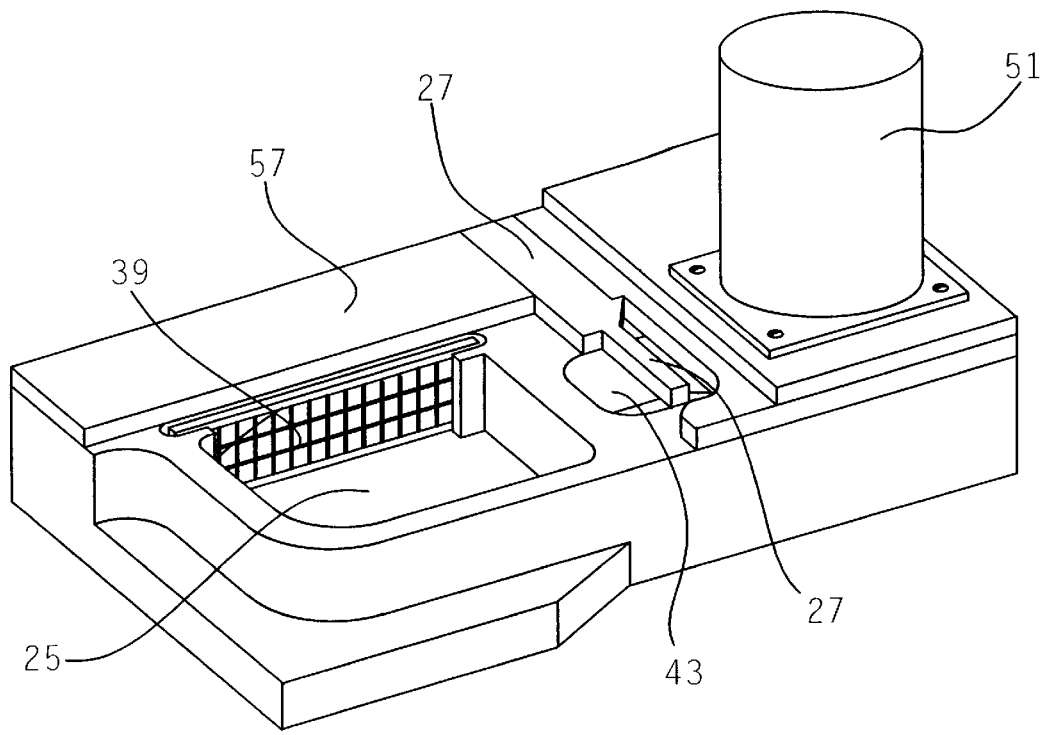
FIG. 6 is a perspective view of the preferred embodiment of this portion of the invention.
Figure 7:
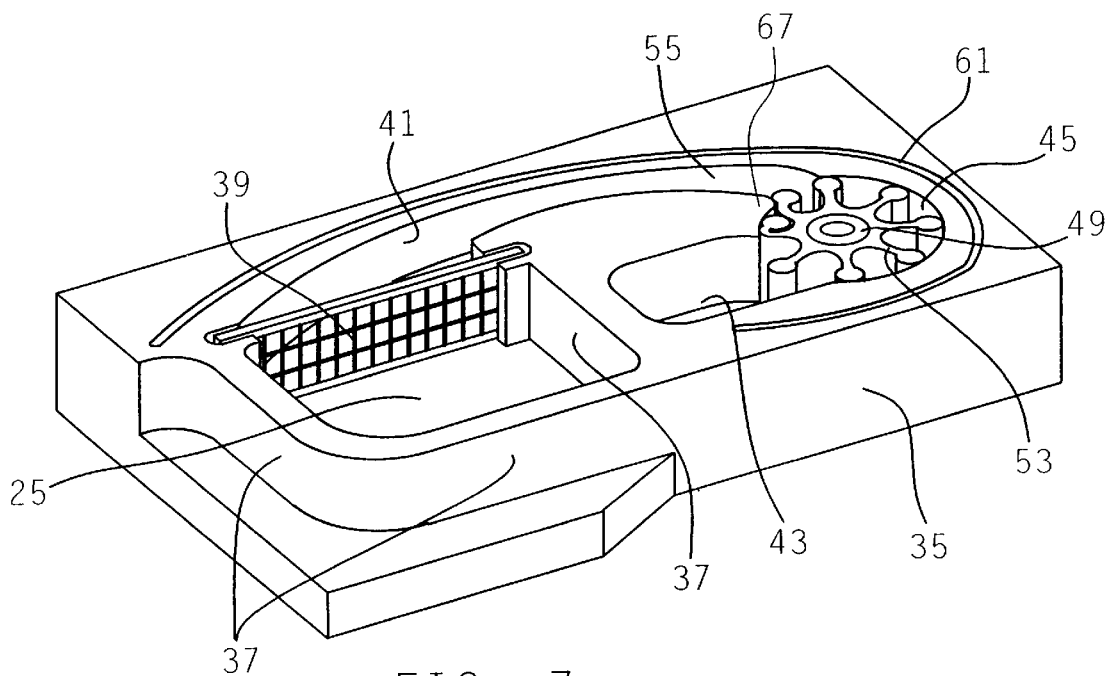
FIG. 7 is the same view as in FIG. 6 but with the top cover removed to show the interior and the parts employed therein.
Figure 8:
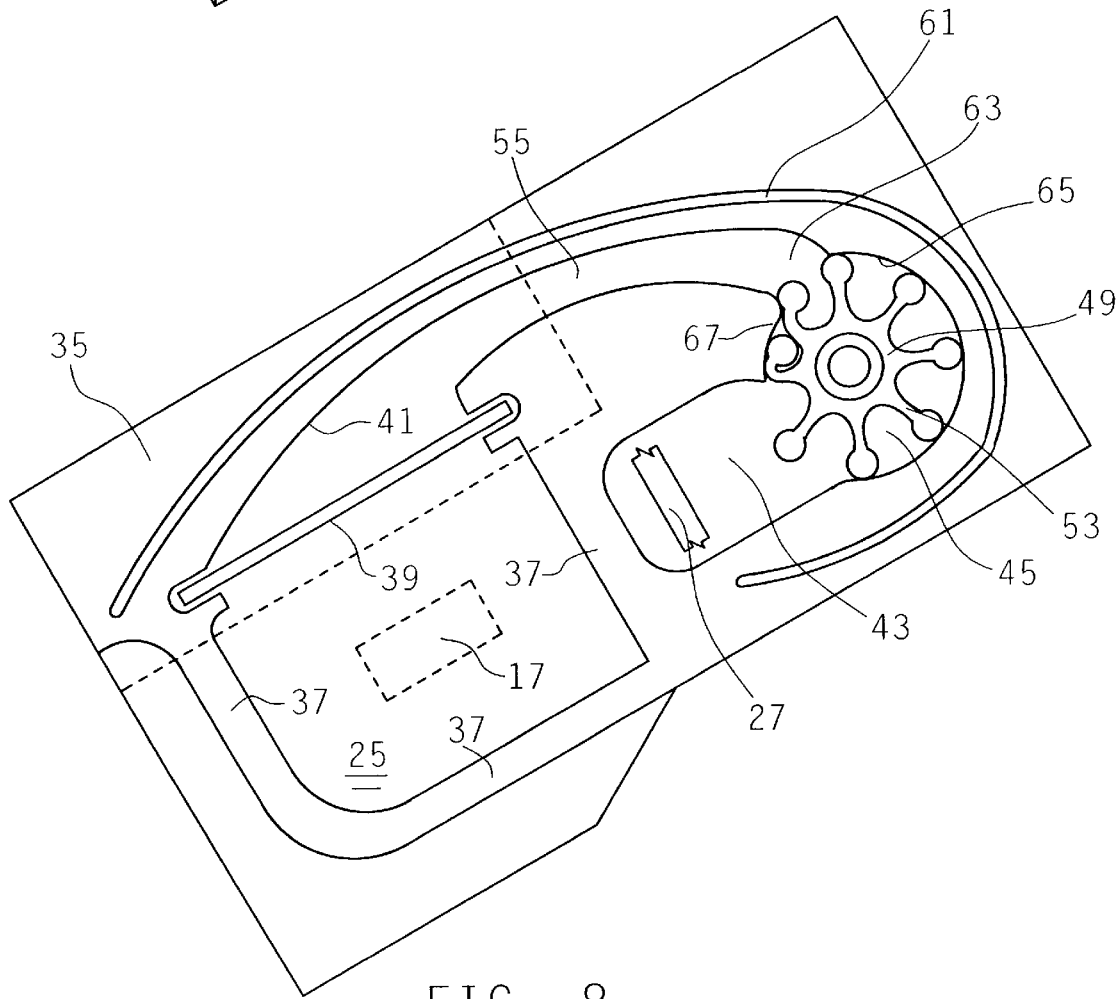
FIG. 8 is a top view of the embodiment shown in FIGS. 6 and 7 to further show the workings of this portion of the invention; and, FIG. 9 is a perspective view of a replaceable portion of the embodiment shown in FIGS. 6–8.

The paste recovery system of this invention is shown in FIGS. 6, 7 and 8. In the figures, the system comprises a flat base 35 on which is supported reservoir 25 surrounded on three sides by walls 37 and on the fourth side by a removable filter screen 39 behind which is a fourth wall 41. A sump 43 is provided on said base 35 separated from reservoir 25 by one of the side walls 37 that feeds into a pump plenum 45 in which a pump impeller 49 is operably located for turning by a motor 51 through a drive shaft (not shown). Pump impeller 49 is characterized by having a plurality of pump impeller vanes 53 of flexible nature that will distort as they rotate in plenum 45.

A side loop 55 is provided running from pump plenum 45 around one side of reservoir 25 and back into said reservoir 25 through screen 39. A cover plate 57 is provided over plenum 45, impeller 49, vanes 53 and loop 55 and sealed against a flexible seal 61 to form that part of the paste recovery system into a pressurized system with the turning of impeller 49 and vanes 53 providing the propulsion for the paste passing therethrough.

In operation, doctor blade 27 (FIG. 7), mounted over one part of sump 43 is designed to contact circumferential surface 19 of wheel 17 and scrape off unapplied paste from said wheel and hard pieces of paste and chips inadvertently drawn out of masks 7 in belt 1 and pass it down into sump 43. Sump 43 is separated from reservoir 25 to insure that none of this unusable material can get into the usable paste and contaminate it. Pump impeller 49 is turned by motor 51 in a slow manner and the recovered paste and chips are passed through plenum 45.

The action of impeller 49 is very slow and no centrifugal force is generated such as with other such impellers. The flexible nature of impellers 49 comes into play when the paste is moved toward the outlet 63 of plenum 45. Here, as shown in FIGS. 7 and 8, impellers 49 distort, because of the squeezing nature of side sump side wall 65 and a small portion 67 of plenum side wall, thereby squeezing paste and its debris into loop 55. As more and more paste and debris is squeezed into loop 55, it is all passed through the loop back toward reservoir 25. As it passes through screen 39, the hard particles of silver paste and the chips dragged off belt 1 are filtered out and only usable paste is passed back into reservoir 25 for reuse with wheel 17. During maintenance, screen 39 is removed and the debris and chips are discarded.

Figure 9:
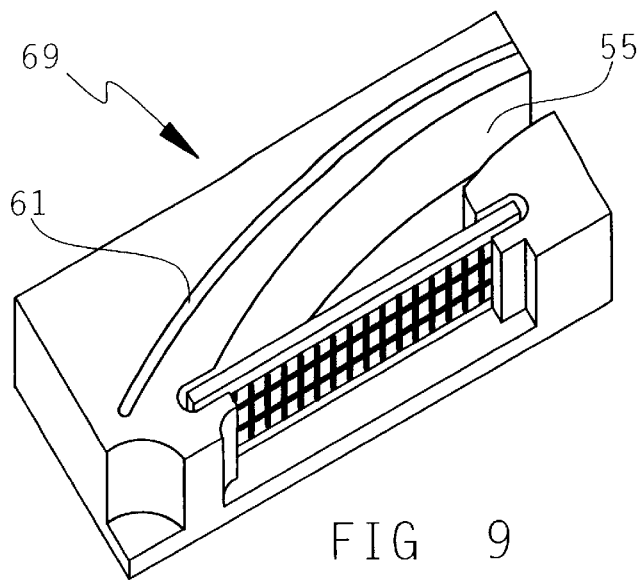

As shown in FIG. 9, a small portion 69 of base 35 can be fashioned into a replaceable part that can be set into a similar cut-out portion (shown in dotted lines in FIG. 8) in the base recovery system. This would make maintenance simpler by being able to replace a piece of loop 55 and screen 39 without having to remove all the parts of the system and wash them all with solvent or other cleaning compound.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the way to achieve substantially the same result are within the scope of this invention.

What is claimed is:

1. A chip termination machine, wherein a plurality of chips are terminated at opposite ends with an electrically conductive paste, comprising a conveyance means to conduct the chips through consecutive stages, said stages comprising a first paste termination unit including a first reservoir of paste, a first dryer, a second paste termination unit including a second reservoir of paste, a second dryer, an unloading unit where the terminated chips are ejected from said machine, and a means for recovering and cleaning unused termination paste from said first and said second reservoirs for reuse therewith, said means for recovering and cleaning unused termination paste comprising:
    a) a base for mounting on said machine;
    b) a sump mounted on said base for receiving unused paste and debris from one of said reservoirs of paste;
    c) a pump having an inlet and an outlet, said pump inlet in communication with said sump for drawing a stream of paste from said sump;
    d) a by-pass loop formed on said base to return paste from said pump to said reservoir;
    e) a filter in said bypass loop, said filter having a filter inlet side, to receive paste and debris pumped thereto from said pump outlet, and a filter outlet side to issue filtered paste therefrom for flow back to said reservoir;
    f) wherein said pump comprises:
        i) a pump plenum in which a pump impeller is operably located for turning in the recovered paste; and,
        ii) a motor to drive said pump impeller in said plenum.

2. The chip termination machine of claim 1 wherein said pump impeller comprises a plurality of flexible pump impeller vanes that flex slowly during rotation under power from said motor to move said paste in a slow flow from said pump outlet into said bypass loop.

3. The chip termination machine of claim 2 wherein said pump plenum includes side walls of a nature as to deform said impeller vanes, during turning thereof, to squeeze the paste from said impeller into said bypass loop.

4. A recovery system for recovering and cleaning unused paste from a machine comprising:
    a) a base for operable connection to the machine;
    b) a sump mounted on said base for receiving recovered paste and debris from the machine;
    c) a pump having an inlet and an outlet, said pump mounted on said base in communication with said sump, said inlet arranged to draw a stream of paste from said sump;
    d) a by-pass loop formed on said base and in fluid communication with said pump outlet for returning paste from said pump to said machine;
    e) a filter in said bypass loop, said filter having a filter inlet side, to receive paste and debris pumped thereto from said pump outlet, and a filter outlet side to issue filtered paste therefrom for flow back to said machine;
    f) wherein said pump comprises:
        i) a pump plenum in which a pump impeller is operably located for turning in the recovered paste; and,
        ii) a motor set above said impeller to drive said pump impeller in said plenum in a rotary motion.

5. The recovery system for recovering and cleaning unused paste from a machine of claim 4 wherein said pump impeller includes a plurality of flexible pump impeller vanes that flex slowly during rotation, under power from said motor, to move said paste in a slow flow from said pump means into said bypass loop.

6. The recovery system for recovering and cleaning unused paste from a machine of claim 4 further including a cover for positioning over said pump, said bypass and said filter, and wherein said pump plenum includes side walls of a nature as to deform said impeller vanes, during turning thereof, to squeeze the paste from said impeller into said bypass loop.

7. Apparatus for recovering and cleaning unused termination paste from a reservoir located on a chip termination machine comprising:
    a) a base arranged for connection to the machine;
    b) a sump mounted in said base for receiving recovered paste and debris from the reservoir;
    c) a pump having a pump inlet and a pump outlet, said pump mounted on said base in fluid communication with said sump, said pump inlet arranged to draw a stream of paste from said sump;

d) a by-pass loop formed in said base and in fluid communication with said pump outlet for conveying paste from said pump;

e) a filter in said bypass loop, said filter having a filter inlet side, to receive paste and debris pumped thereto from said pump outlet, and a filter outlet side to issue recovered and filtered paste therefrom;

f) wherein said pump comprises:
   i) a pump plenum, defined by plenum side walls, in which a pump impeller is operably located for turning in the recovered paste; and,
   ii) a motor set above said impeller to drive said pump impeller in said plenum in a rotary motion.

8. The apparatus for recovering and cleaning unused termination paste of claim 7 wherein said filter outlet side is in communication with a paste reservoir from which the paste was recovered to convey recovered paste thereto.

9. The apparatus for recovering and cleaning unused termination paste of claim 7 wherein said side walls of said pump plenum are of a nature as to deform said impeller vanes, at one point in said plenum, during turning thereof, to squeeze the paste from said pump into said bypass loop.

10. The apparatus for recovering and cleaning unused termination paste of claim 7 further including a cover for positioning over said pump said bypass loop and said filter to confine the pumped paste therein into a flowable, pressurized stream.

11. The apparatus for recovering and cleaning unused termination paste of claim 7 wherein said filter and a portion of said bypass loop are replaceable.

* * * * *